United States Patent [19]
Lu et al.

[11] Patent Number: 5,594,682
[45] Date of Patent: Jan. 14, 1997

[54] HIGH DENSITY SELF-ALIGNED STACK IN TRENCH DRAM TECHNOLOGY

[75] Inventors: Chih-Yuan Lu; Horng H. Tseng, both of Hsin-Chu, Taiwan

[73] Assignee: Industrial Technology Research Institute, Hsin-Chu, Taiwan

[21] Appl. No.: 428,773

[22] Filed: Apr. 24, 1995

Related U.S. Application Data

[62] Division of Ser. No. 263,455, Jun. 22, 1994, Pat. No. 5,429,978.

[51] Int. Cl.$^6$ .................................................. G11C 11/24
[52] U.S. Cl. ........................... 365/149; 257/301; 257/296
[58] Field of Search ................................ 365/149, 182; 257/301, 296

[56] References Cited

U.S. PATENT DOCUMENTS

| | | | |
|---|---|---|---|
| 4,650,544 | 3/1987 | Erd et al. | 156/653 |
| 4,717,942 | 1/1988 | Nakamura et al. | 365/149 X |
| 4,797,719 | 1/1989 | Ueda | 365/149 X |
| 4,855,952 | 8/1989 | Kiyosumi | 365/149 |
| 4,859,622 | 8/1989 | Eguchi | 437/47 |
| 4,978,634 | 12/1990 | Shen et al. | 437/52 |
| 4,980,310 | 12/1990 | Matsuda et al. | 437/52 |
| 5,106,774 | 4/1992 | Hieda et al. | 437/52 |
| 5,204,280 | 4/1993 | Dhong et al. | 437/52 |
| 5,250,458 | 10/1993 | Tsukamoto et al. | 365/149 X |
| 5,256,588 | 10/1993 | Witek et al. | 437/52 |

OTHER PUBLICATIONS

"A 0.6 μm$^2$ 256Mb Trench DRAM Cell With Self–Aligned BuriEd STrap (BEST)" by L. Nesbit et al. pp. 627–630, Tech. Dig of IEDM, 1993.

Primary Examiner—David C. Nelms
Assistant Examiner—Huan Hoang
Attorney, Agent, or Firm—George O. Saile; Stephen B. Ackerman

[57] ABSTRACT

A method, and resultant structure, is described for fabricating a high density DRAM cell in which a stacked capacitor using a pillar structure is formed in a trench. The DRAM cell includes a field effect transistor having a gate electrode and source/drain elements. A first insulating layer is patterned to create an exposed region wherein a first trench is formed in the silicon substrate, between the gate electrode and the field oxide. A second insulating layer is formed, and then removed from a portion of the bottom of the first trench to expose the silicon substrate. The silicon substrate is thermally oxidized at the bottom of the first trench to form an insulating layer mask. The remainder of the second insulating layer is removed. The portion of the silicon substrate in the first trench that is not masked by the insulating layer mask is vertically etched, whereby a pillar is formed under the insulating layer mask in the center of the final trench. The insulating layer mask is removed. A conductive layer is formed along the surfaces of the final trench and the pillar, adjacent to the source region of the field effect transistor, whereby the conductive layer is a capacitor signal node. A capacitor dielectric is formed over the conductive layer. A capacitor ground plate is formed over the capacitor dielectric.

7 Claims, 9 Drawing Sheets

HIGH DENSITY SELF-ALIGNED STACK IN TRENCH DRAM TECHNOLOGY

This application is a divisional of application Ser. No. 08/263,455, filed Jun. 22, 1994 and now U.S. Pat. No. 5,429,978.

BACKGROUND OF THE INVENTION

(1) Field of the Invention

This invention relates to a method of making and the resultant structure for a high density self-aligned DRAM (Dynamic Random Access Memory) cell, and more particularly to a method for producing a stacked capacitor structure, as part of the DRAM cell, in a trench.

(2) Description of the Related Art

A typical DRAM cell consists of a single transistor and a storage capacitor. Digital information is stored in the capacitor and accessed through the transistor, by way of addressing the desired memory cell, which is connected with other such cells through an array of bit lines and word lines. In order to construct high density DRAMs in a reasonably sized chip area, both the transistor and capacitor elements must occupy less lateral space in each memory cell. As DRAMs are scaled down in dimensions, there is a continuous challenge to maintain a sufficiently high stored charge per capacitor unit area. Efforts to increase capacitance without increasing the planar area of the capacitor have been concentrated on building three dimensional capacitor structures, which increase the capacitor surface area. Thus cell structures have to change from the conventional planar-type capacitors to either trench capacitors or stack capacitors, in particular at densities above 4 Mbit.

When the stacked capacitor approach is used to fabricate 16 Mbit DRAMs and beyond, very complicated stacked structures are needed, such as fin structures, crown structures, and so forth. These typically are difficult to manufacture, and make it more difficult to form subsequent layers due to topological problems.

The trench capacitor is typically built in an opening in the substrate and thus does not effect the topology. When fabricating trench capacitors for DRAMs with densities of 16 Mbit and beyond, however, the trench needs to be very deep. There are technology and even theoretical physical limitations to processing the deep trenches that would be needed. As can be seen in "A 0.6 um2 256Mb Trench DRAM Cell with Self-Aligned BuriED STrap (BEST)", by L. Nesbit et al, pp. 627–630, Tech. Dig. of IEDM, 1993, formation of a trench and the contact between the device and storage node is complex, very specific to trench formation and not applicable generally to forming a CMOS (Complementary Metal Oxide Semiconductor) technology module. Also, as can be seen in FIG. 5 of the above paper, the aspect ratio of the trench can be as large as 15–20, and the filling in of such a high aspect ratio well is extremely difficult. Other prior art single trenches are 10 to 15 micrometers deep with a diameter of 0.5 micrometers. A further problem with deep trenches is that the wafer may become mechanically unstable with so many deep trenches, for in a 64 Mbit memory, for example, 64 million trenches (at one capacitor per cell) are needed.

Workers in the art are aware of these problems, and have attempted to resolve them. For example, in U.S. Pat. No. 5,204,280 (Dhong et al) a method is shown for forming multiple pillars in a shallow trench in a silicon substrate. Hemispherical grain polysilicon is used as an etch mask to form the pillars. However, it is not shown how a node contact to a DRAM transistor would be formed, and the use of multiple pillars per trench increases the chip surface area occupied by the capacitor.

SUMMARY OF THE INVENTION

It is therefore an object of the invention to provide a method for fabricating a high density DRAM cell in which a stacked capacitor using a pillar structure is formed in a trench.

It is a further object of the invention to provide a method for fabricating a high density DRAM cell with a stack-in-trench capacitor in which the capacitor is self-aligned with the cell switching transistor.

It is a further object of the invention to provide a high density self-aligned DRAM cell with a stacked capacitor structure in a trench.

In accordance with the objects of this invention, there is shown a method for fabricating a DRAM cell which includes a field effect transistor having a gate electrode and source/drain elements. A silicon substrate, having field oxide isolation regions which isolate the field effect transistor, is provided. A first insulating layer is formed over the field effect transistor and the field oxide isolation regions. The first insulating layer is patterned to create an exposed region of the silicon substrate between the gate electrode and the field oxide isolation region. The exposed region is etched to form a first trench in the silicon substrate. A second insulating layer is formed over the field effect transistor, the field oxide isolation region and in the first trench. The second insulating layer is removed from a portion of the bottom of the first trench to expose the silicon substrate. The silicon substrate is thermally oxidized at the bottom of the first trench to form an insulating layer mask. The remainder of the second insulating layer is removed from the first trench, the field effect transistor and the field oxide isolation region. The portion of the silicon substrate in the first trench that is not masked by the insulating layer mask is vertically etched, whereby a pillar is formed under the insulating layer mask in the center of a final trench. The insulating layer mask is removed. A conductive layer is formed along the surfaces of the final trench and the pillar, adjacent to the source region of the field effect transistor, whereby the conductive layer is a capacitor signal node. A capacitor dielectric is formed over the conductive layer. A capacitor ground plate is formed over the capacitor dielectric.

Further in accordance with the invention there is described a structure of a DRAM cell. A silicon substrate having field oxide isolation regions is provided. A field effect transistor having a gate electrode, a source region and a drain region, is formed in and on the silicon substrate. There is a trench, formed in the silicon substrate in the region between the source region and the field oxide isolation region. A pillar is formed in the center of, and extending up from the bottom of, the trench. A capacitor signal node is formed at the surface of the trench and the pillar, in contact with the source region of the field effect transistor. There is a capacitor dielectric over the capacitor signal node, and a capacitor ground plate over the capacitor dielectric. An insulating layer is formed over the field effect transistor, the capacitor ground plate and the field oxide isolation region. A metal bit line node contact connects to the drain region through an opening in the insulating layer.

DESCRIPTION OF THE PREFERRED EMBODIMENTS

Figure 1:
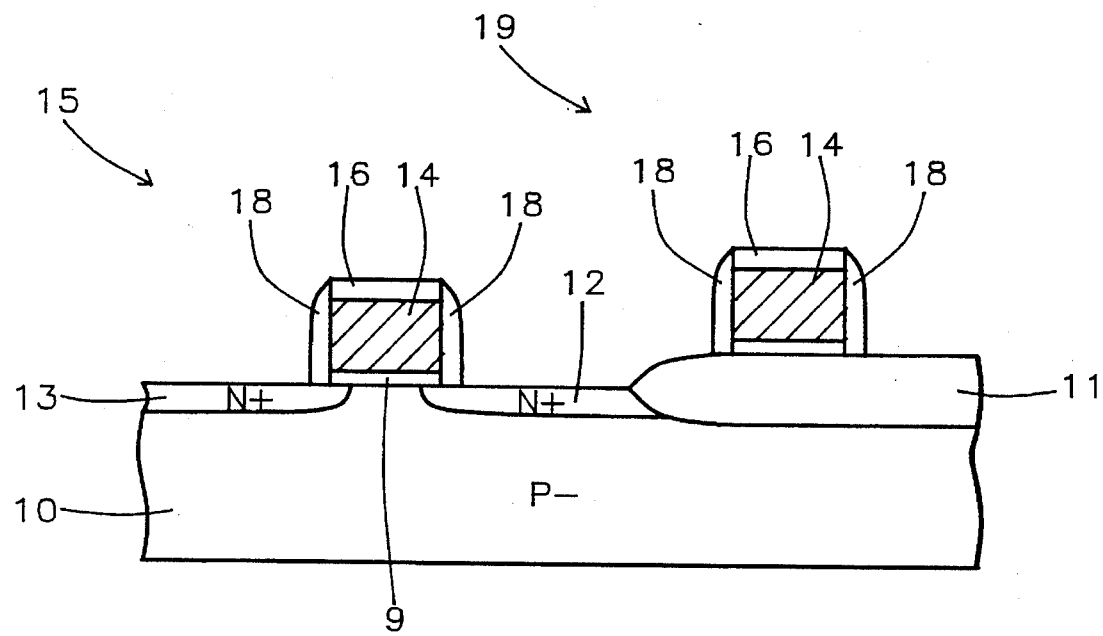
FIGS. 1 to 5, 6, 6A and 7 to 13 are a cross-sectional representation of a first method of the invention, and the resultant structure, for a high density self-aligned DRAM cell with a stack-in-trench capacitor.

A first method for fabricating the DRAM cell of the invention will now be described with reference to FIGS. 1 to 13. As shown in FIG. 1, a base substrate 10 of, for example, P- monocrystalline silicon, is provided. Field oxide (FOX) isolation regions 11 are formed and serve to isolate semiconductor surface regions from other such regions in the silicon substrate. In an effort to simplify the description and the drawings, the field oxide isolation regions between devices have been only partially shown and will not be described in detail, because they are conventional. One method is described by E. Kooi in U.S. Pat. No. 3,970,486, wherein selected surface portions of a silicon substrate are masked against oxidation, and the exposed unmasked surface is oxidized to grow a thermal oxide which in effect sinks into the silicon surface at the unmasked areas. The mask is removed, and semiconductor devices can then be formed in the openings between the isolation regions.

The formation of the field effect transistor 15 and the interconnection 19, both shown in FIG. 1, will now be described. A gate oxide layer 9 is formed, typically by thermal oxidation of the silicon substrate. A layer of polysilicon 14 is formed on the surface of the gate oxide and FOX 11 and is ion implanted with phosphorous or arsenic ions at a dosage of between about 5 E 15 and 1 E 16 atoms/cm.2 and an energy of between about 20 and 60 Kev., or is doped with phosphorus oxychloride (POCl3) at a temperature of about 900° C. Alternatively, the polysilicon layer may be doped in situ. A layer of silicon oxide 16 is formed, typically by LPCVD (Low Pressure Chemical Vapor Deposition), over the polysilicon, and the three layers are then patterned to form a gate electrode for the FET 15 and the interconnection 19. The bit line and FET drain region 13, and the source region 12, are then formed by ion implantation of phosphorus or arsenic at a dosage of between about 2 E 15 and 1 E 16 atoms/cm.2 and an energy of between about 20 and 70 KeV. Sidewall spacers 18 are formed by depositing silicon oxide and an anisotropic etch.

Figure 2:
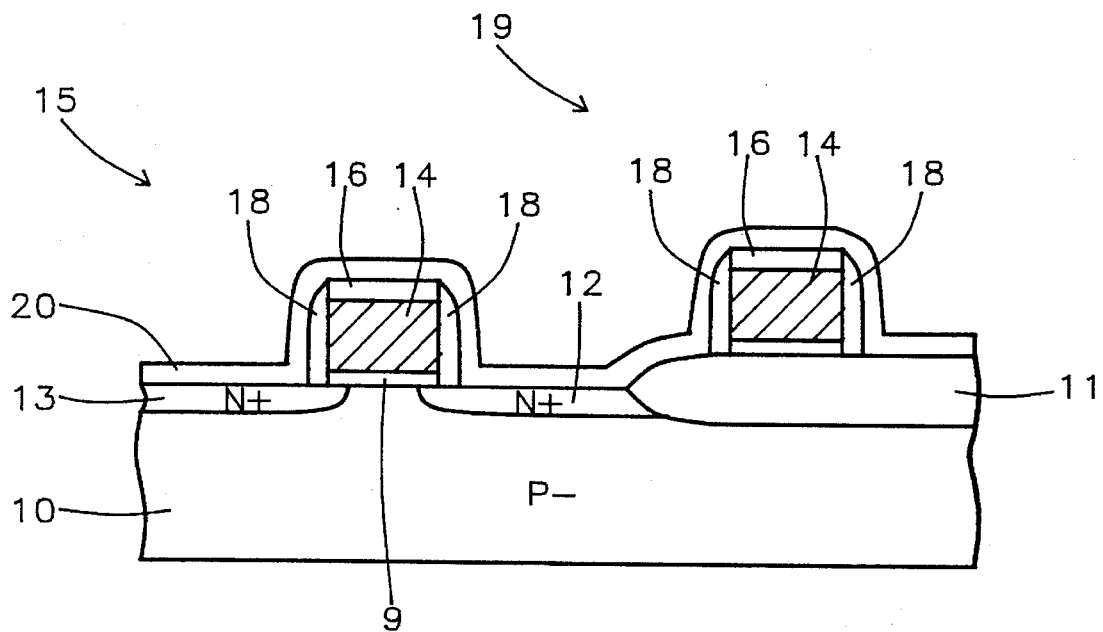
Figure 3:
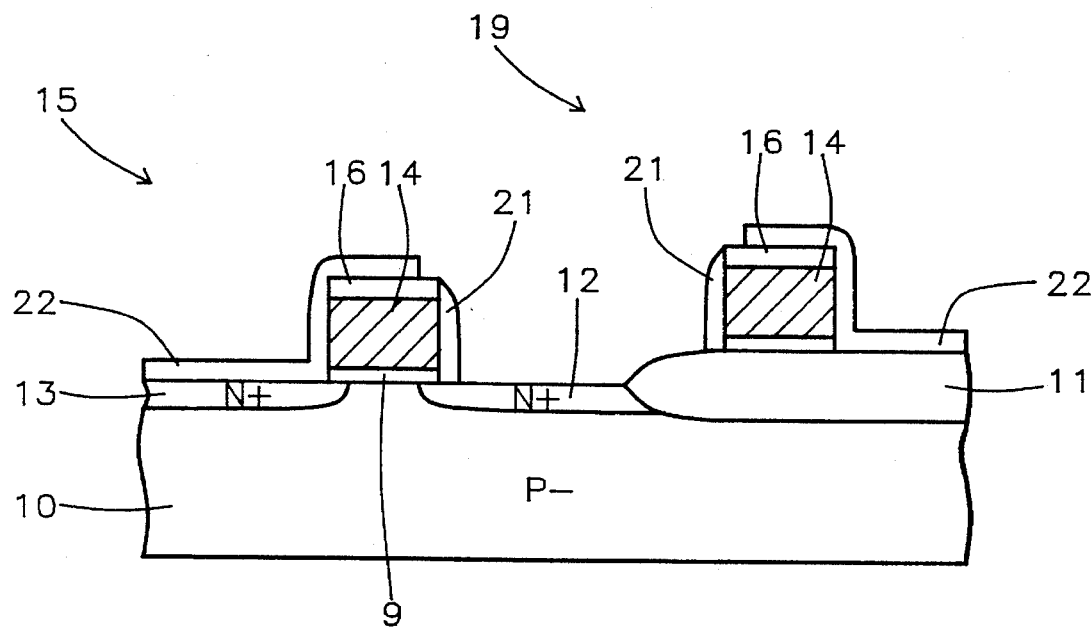

The formation of the capacitor is shown in FIGS. 2 through 12. Referring to FIG. 2, an oxide layer 20 with a thickness of between about 300 and 800 Angstroms is formed, typically by LPCVD. This layer is then etched, as can be seen in FIG. 3, using conventional lithography and etching techniques, to expose the surface of source region 12, where the trench for the memory cell capacitor is to be formed, and leaving patterned oxide 22. Sidewall spacer 21 remains on the side of the gate electrode for FET 15.

Figure 4:
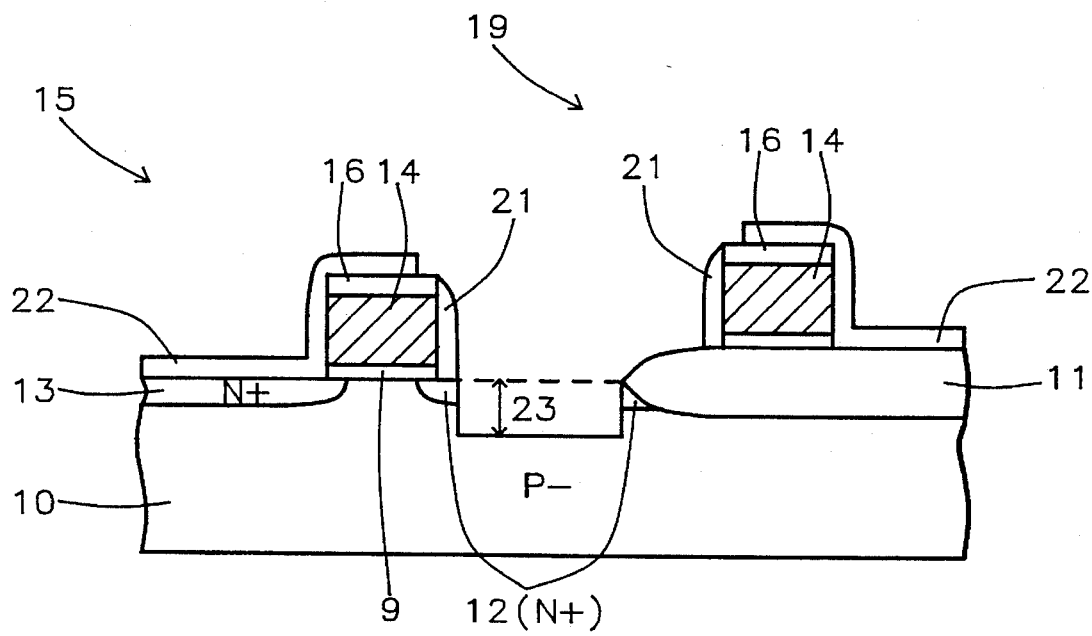

An initial trench is formed, as shown in FIG. 4, by a self-aligned anisotropic etch of the silicon substrate. A reactive ion etch is performed, using He (helium) at 180 sccm and Cl2 (chlorine) at 420 sccm, at a pressure of 450 mtorr and a power of 450 watts, on Rainbow 4400 manufactured by Lam Research Corporation (USA). This is performed to selectively etch Si (silicon) in a self-aligned manner in the region between spacer 21 and FOX 11. It can be seen that the alignment for the previous etch of oxide 22 is not critical, as the self-aligned trench etch is not dependent on precise alignment of the opening in oxide 22. This initial trench is etched to a depth 23 of between about 1000 to 3000 Angstroms, and has a width of between about 0.4 and 0.8 micrometers.

Figure 5:
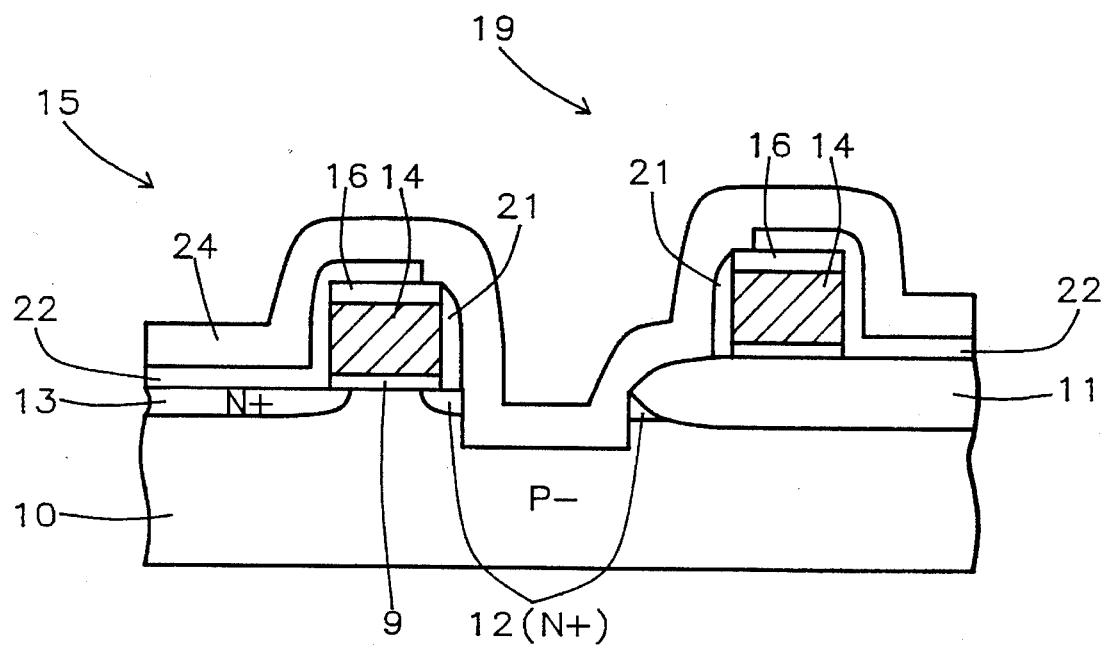
Figure 6:
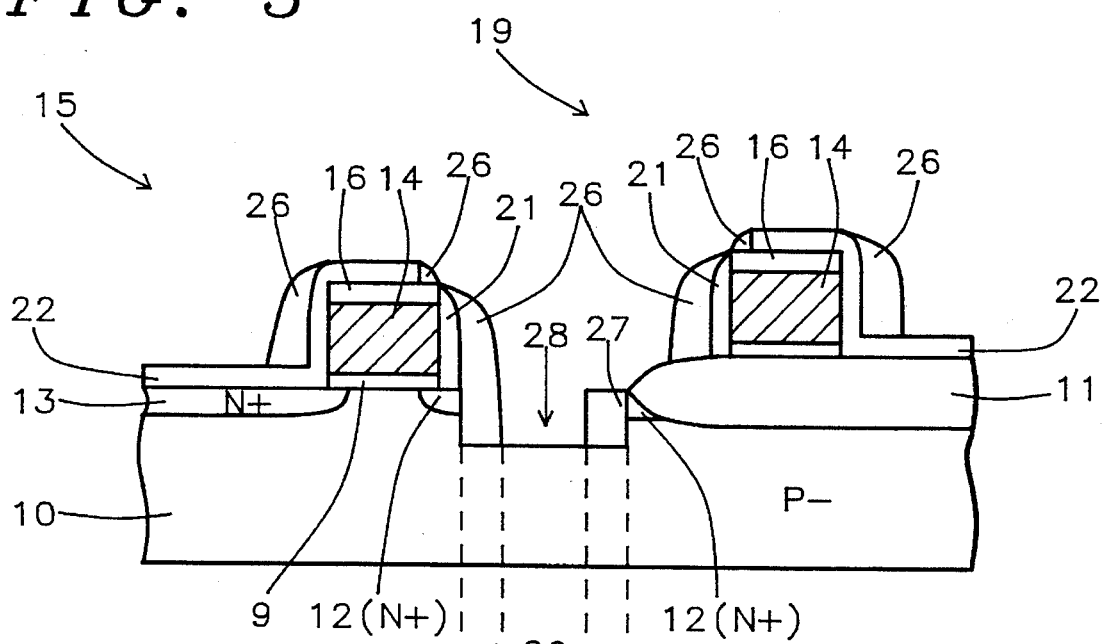
Figure 6A:
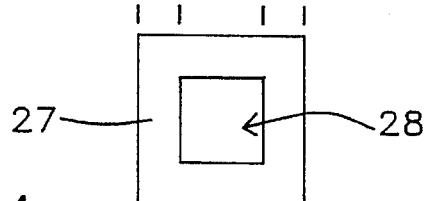

Referring now to FIG. 5, a silicon nitride (Si3N4) layer is deposited by LPCVD to a thickness of between about 1000 and 3000 Angstroms. As shown in FIG. 6, an anisotropic etch is performed, using Ar (argon) at 800 sccm, CF4 (tetrafluoromethane) at 30 sccm and CHF3 (trifluoromethane) at 25 sccm, at a pressure of 360 mtorr and a power of 450 watts, on a Rainbow 4520 (Lam Research Corporation). This etch removes nitride from the bottom of the initial trench to create opening 28. Nitride sidewall 26 remains on the FET gate electrode and on interconnection 19, and nitride 27 remains on one wall of the trench. The pattern of the trench etch can be seen in FIG. 6A, in which opening 28 is shown with a width 29 of between about 0.1 and 0.3 micrometers. This opening dimension can be less than the minimum feature size since the thickness of the nitride layer 24, and not lithographic limits, determines the size of the opening 28.

Figure 7:
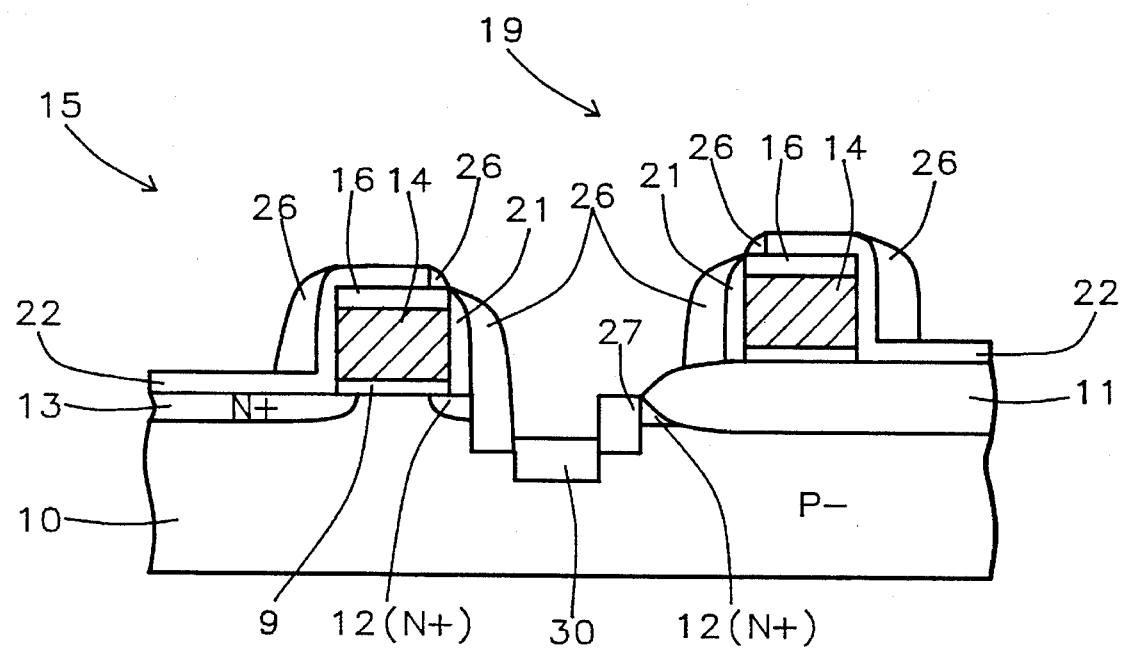
Figure 8:
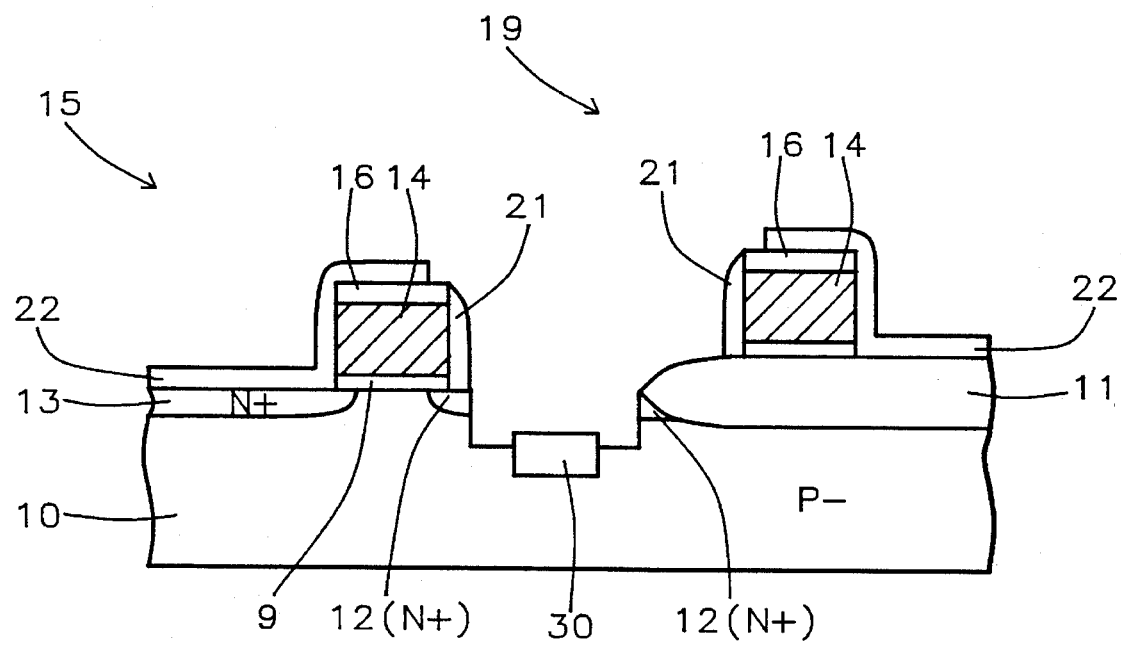

With reference to FIG. 7, a mask 30 is now formed in opening 28 by thermally oxidizing, in a wet oxygen ambient, the exposed silicon at a temperature of between about 870° and 880° C. for between about 8 and 30 minutes, to form a thickness of silicon dioxide (SiO2) of between about 200 and 600 Angstroms. This mask 30 will be used to form the pillar in the trench, to be subsequently formed. As shown in FIG. 8, the remaining areas of silicon nitride are removed by a wet etch in hot phosphoric acid (H3PO4), at a temperature of between about 160° and 180° C.

Figure 9:
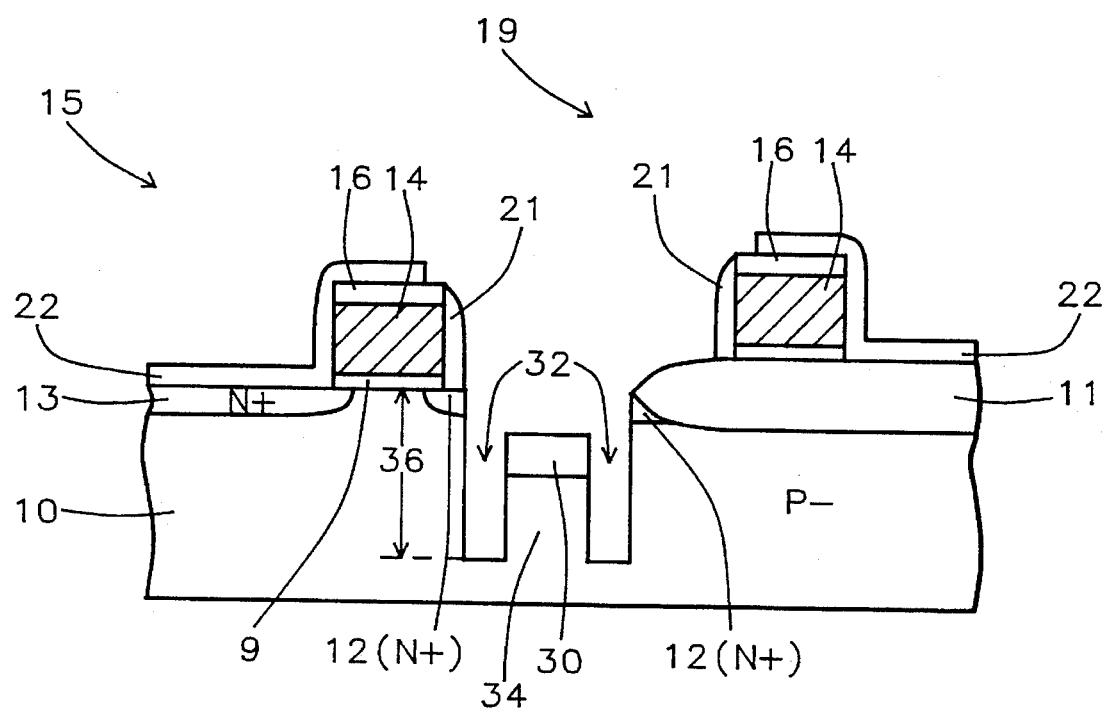

Referring now to FIG. 9, a pillar 34 is formed, centered in final trench 32, by anisotropically etching the trench silicon not masked by oxide mask 30. This is accomplished by a reactive ion etch, using He at 180 sccm and Cl2 at 420 sccm, at a pressure of 450 mtorr and a power of 450 watts, on a Rainbow 4400. This creates a final trench to a depth 36 of between about 5000 and 12000 Angstroms. The thin SiO2 mask 30 is removed by a dip etch in buffered HF (hydrofluoric acid).

Figure 11:
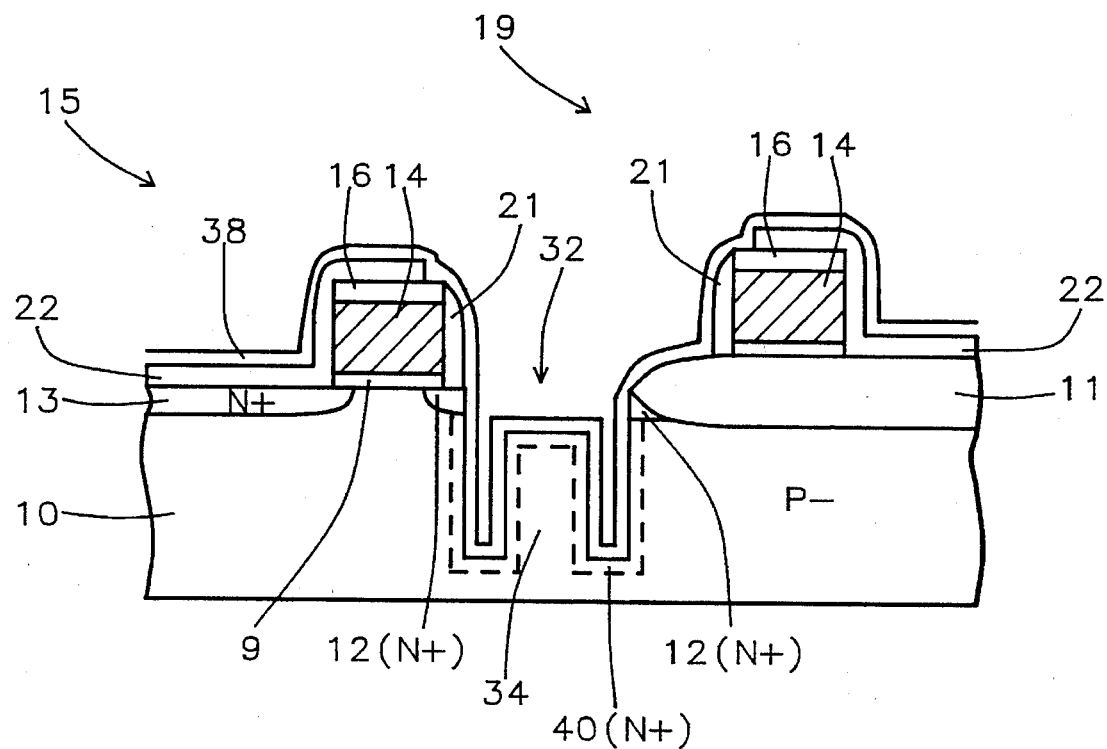

Formation of the first electrode of the capacitor is now described, with reference to FIG. 11. A layer of N+ doped phosphosilicate glass (PSG or P-glass) 38 is formed over the surfaces of the trench and pillar and elsewhere on the wafer, to a thickness of between about 1000 and 3000 Angstroms. This layer is formed by APCVD (Atmospheric Pressure CVD) or LPCVD. A doped oxide is formed by adding a small amount of a dopant hydride, such as phosphine or arsine, or a dopant halide, or organic compounds, such as TEOS (tetraethoxysilane)+TMP+O2+O3. Using 2 to 10% wt. phosphorus doped PSG provides a diffusion source. An additional ion implanting is optionally performed, using phosphorous or arsenic ions at a dosage of between about 5 E 15 and 5 E 16 atoms/cm2 and an energy of between about 15 and 35 Kev., or doping is performed with phosphorus oxychloride at a temperature of about 900° C. The capacitor signal node is now formed by outdiffusion from the doped PSG, by a rapid thermal anneal (RTA) at a temperature of between about 900° and 1100° C. for between about 0.2 and 2.0 minutes. This results in capacitor node 40, heavily doped N+ having a depth of between about 500 and 1500 Angstroms, and in contact with source region 12 of the FET. It can be seen that a large surface area results within the walls of trench 32 and pillar 34. The P-glass layer is removed by etching with buffered HF.

Figure 12:
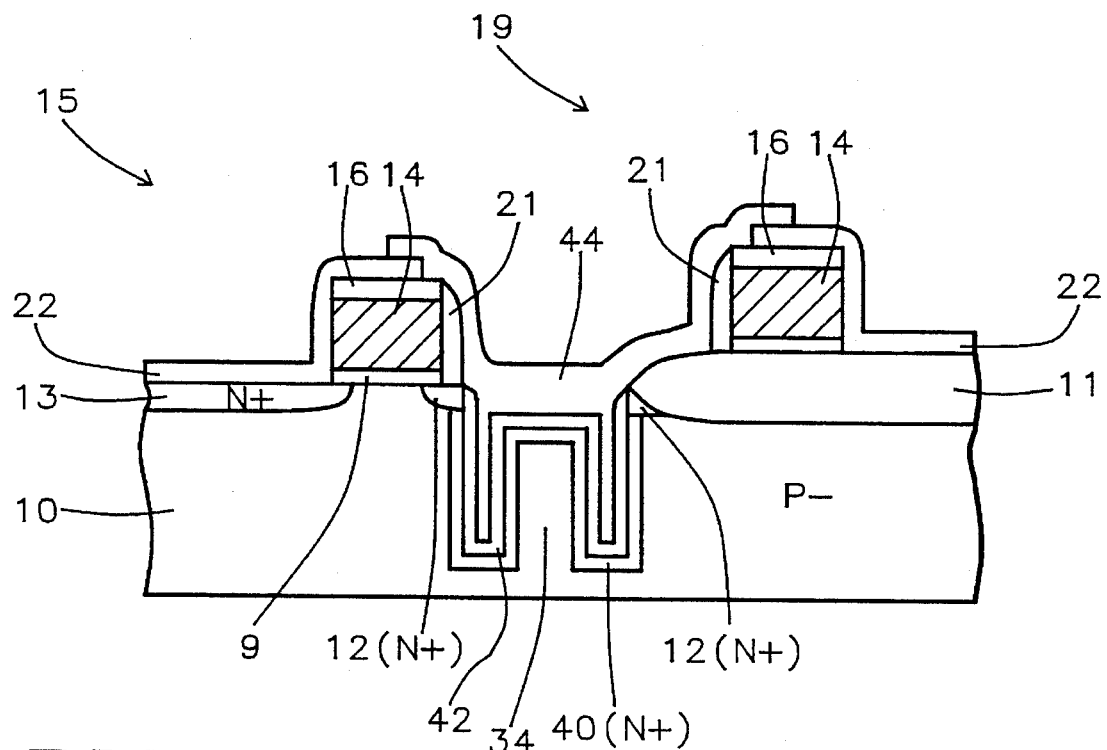

Referring now to FIG. 12, a capacitor dielectric 42 is formed over the surface of the capacitor signal node 40. There are several materials that are suitable for the dielectric, such as ON (oxide-nitride), ONO (oxide-nitride-oxide), or Ta2O5 (tantalum oxide) formed via growth or deposition. The preferred dielectric is formed of ONO to a thickness of between about 30 and 90 Angstroms. The bottom oxide is formed by exposure in DI (deionized) water to a thickness of between about 20 and 40 Angstroms. The middle nitride is formed by LPCVD at a temperature of about 760° C., a pressure of 350 mtorr, in NH3 (ammonia) and SiH4 (silane), to a thickness of between about 20 and 50 Angstroms. The top oxide is formed by oxidation in a dry oxygen ambient, at a temperature of 850° C. for about 30 minutes. This layer is then patterned by reactive ion etching to leave the dielectric 42 only in the trench and over the pillar. The second capacitor node, or ground plate 44, is formed by depositing in-situ doped polysilicon by LPCVD, at a temperature of between about 550° and 600° C., in 15% PH3 (phosphine)+ 85% SiH4, and 5% PH3+95% N2 (nitrogen), to a thickness of between about 1000 and 4000 Angstroms, and is patterned by conventional lithography and etching to result in the FIG. 12 structure.

Figure 13:
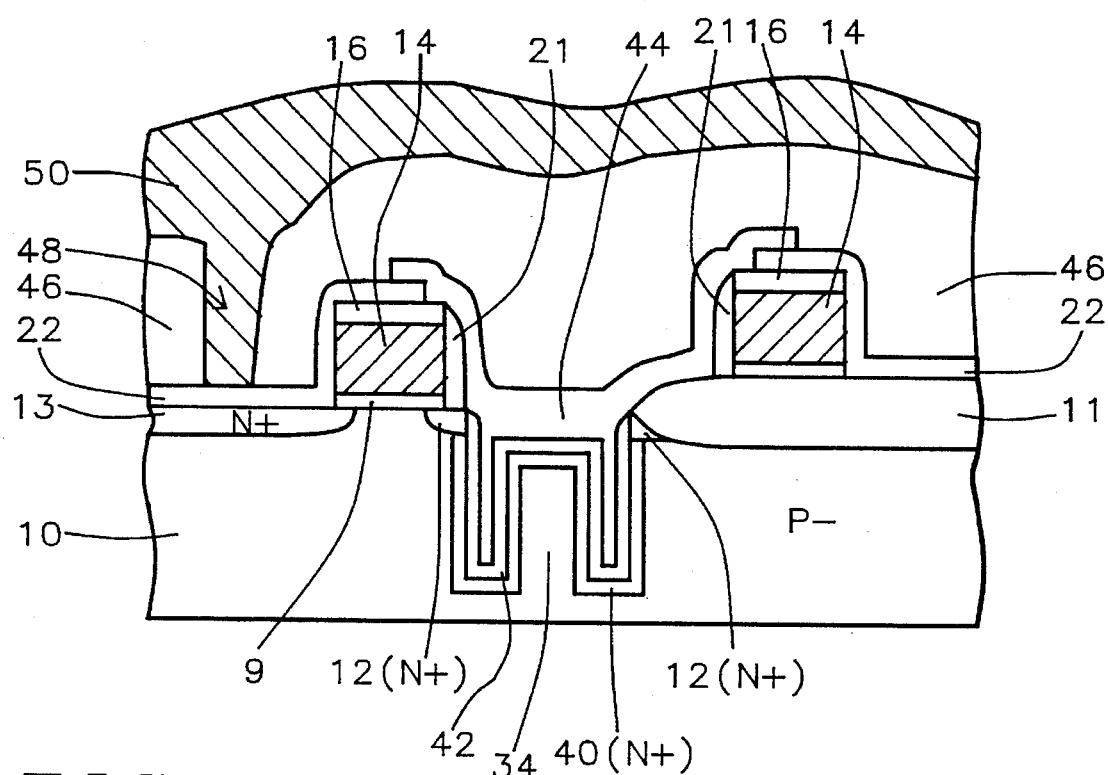

As shown in FIG. 13, completion of the DRAM takes place, by depositing a thick insulating layer of borophosphosilicate glass (BPSG) 46 to a thickness of between about 3000 and 8000 Angstroms, and forming bit line node contact 48 from metallization layer 50, through the BPSG to drain region 13.

Figure 10:
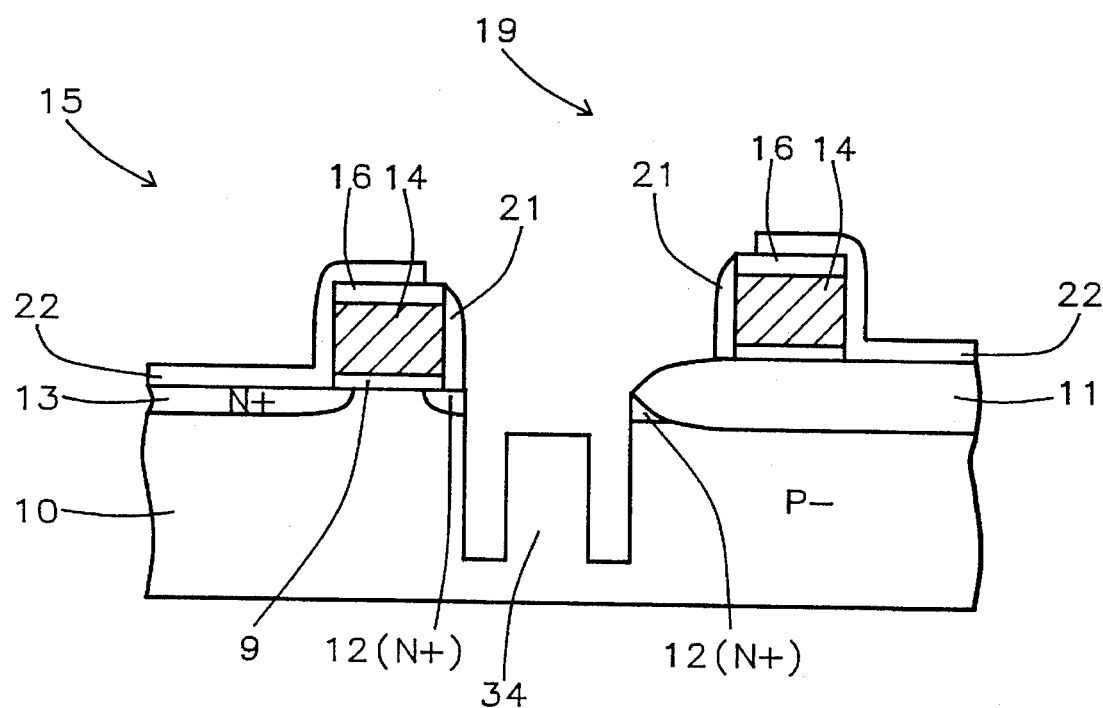
Figure 14:
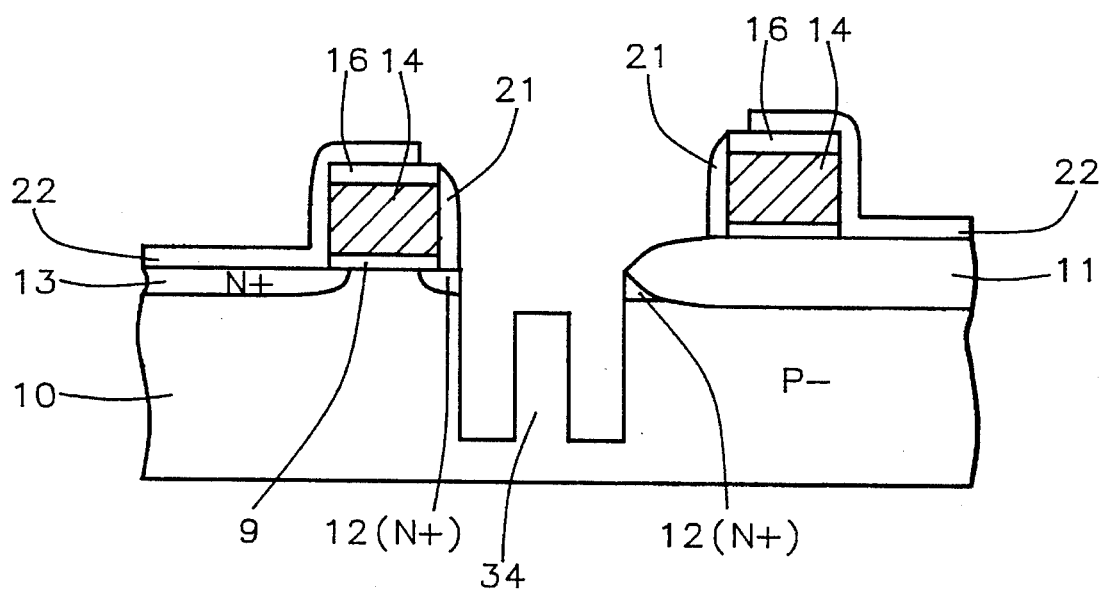
FIGS. 14 to 16 are a cross-sectional representation of a second method of the invention, and the resultant structure, for a high density self-aligned DRAM cell with a stack-in-trench capacitor.
Figure 15:
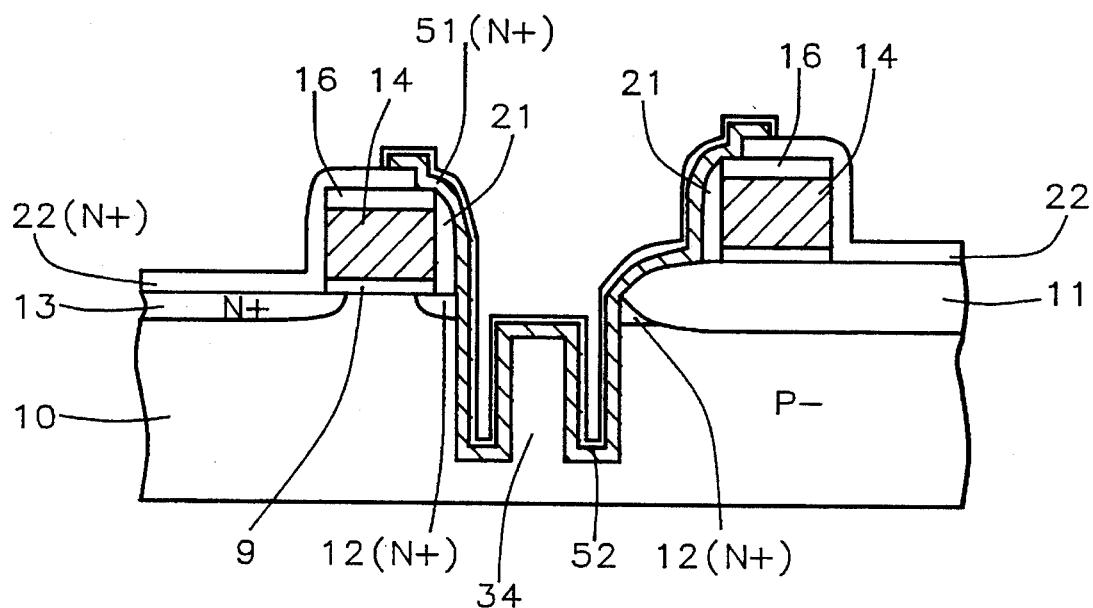
Figure 16:
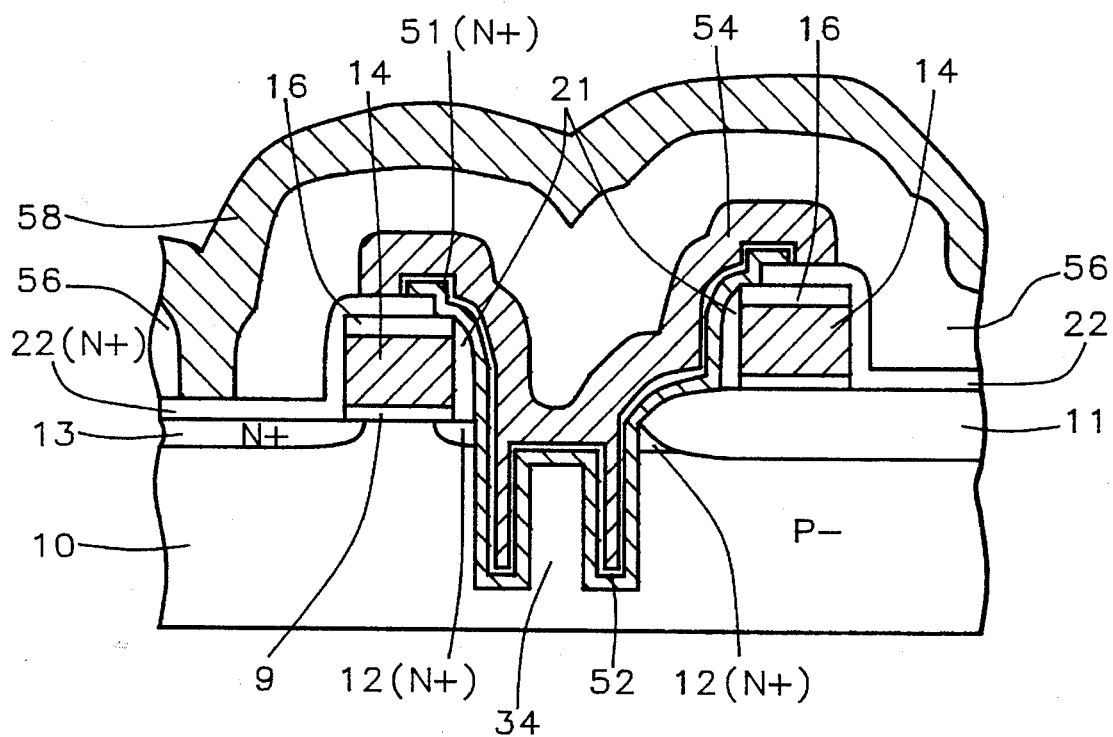

In a second method of the invention, processing is the same as the first method up to the FIG. 10 structure, which is shown in FIG. 14. Referring now to FIG. 15, a thin heavily doped N+ polysilicon layer is formed by depositing in-situ doped polysilicon by LPCVD, at a temperature of between about 550° and 600° C., in 15% PH3+85% SiH4, and 5% PH3+95% N2, to a thickness of between about 500 and 1500 Angstroms, and patterned by conventional lithography and etching to form capacitor signal node 51. Capacitor dielectric 52 is subsequently deposited and patterned, with the same material and by the same technique as in the first method of the invention. With reference to FIG. 16, the structure is completed as in the first method of the invention, with the formation of capacitor ground plate 54, BPSG 56 and bit line node contact 58.

Figure 17:
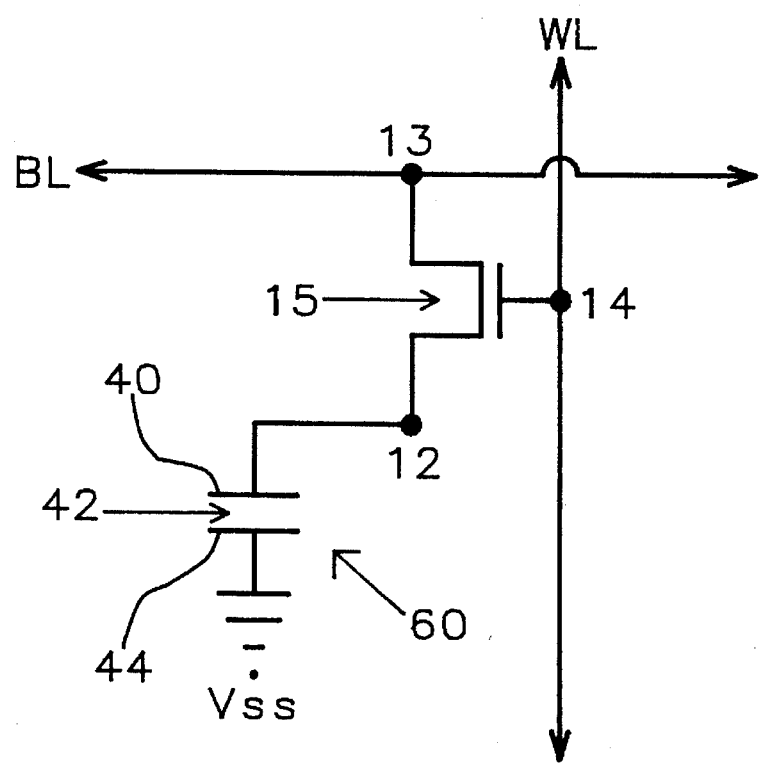
FIG. 17 is a schematic representation of the high density self-aligned DRAM cell with a stack-in-trench capacitor of the invention.

The resulting DRAM cell is shown schematically in FIG. 17, in which similar elements have the same reference numberals as in the previous cross-sectional drawings. FET 15 has drain region 13 connected to bit line BL, gate 14 is connected to word line WL, and source region 12 is connected to the stack-in-trench capacitor 60. The capacitor has first signal electrode 40 (corresponding to node 51 in the second method of FIG. 16), dielectric 42 (corresponding to dielectric 52 of the second method) and ground plate (corresponding to ground plate 54 of the second method).

While the invention has been particularly shown and described with reference to the preferred embodiments thereof, it will be understood by those skilled in the art that various changes in form and details may be made without departing from the spirit and scope of the invention.

What is claimed is:

1. A DRAM (Dynamic Random Access Memory) cell, comprising:

a silicon substrate having field oxide isolation regions;

a field effect transistor having a gate electrode, a source region and a drain region, formed in and on said silicon substrate;

a trench, formed in said silicon substrate in the region between said source region and said field oxide isolation region;

a pillar formed in the center of, and extending up from the bottom of, said trench;

a capacitor signal node at the surface of said trench and said pillar, that runs contiguously over said trench and said pillar, and contacts with said source region of said field effect transistor;

a capacitor dielectric over said capacitor signal node;

a capacitor ground plate over said capacitor dielectric;

an insulating layer over said field effect transistor, said capacitor ground plate and said field oxide isolation region; and a metal bit line node contact connected to said drain region through an opening in said insulating layer.

2. The DRAM cell of claim 1 wherein said trench has a width of between about 0.4 and 0.8 micrometers.

3. The DRAM cell of claim 1 wherein said pillar has a width of between about 0.1 and 0.3 micrometers.

4. The DRAM cell of claim 1 wherein said capacitor signal node is formed under the surface of said trench and said pillar, in said silicon substrate.

5. The DRAM cell of claim 1 wherein said capacitor signal node is formed over the surface of said trench and said pillar.

6. The DRAM cell of claim 5 wherein said capacitor signal node is formed of polycrystalline silicon.

7. The DRAM cell of claim 1 wherein said trench has a depth of between about 5000 and 12000 Angstroms.

\* \* \* \* \*